US009708213B2

(12) United States Patent
Shiragami et al.

(10) Patent No.: US 9,708,213 B2
(45) Date of Patent: Jul. 18, 2017

(54) SEALING MATERIAL

(71) Applicant: Nippon Electric Glass Co., Ltd., Shiga (JP)

(72) Inventors: Toru Shiragami, Shiga (JP); Kentaro Ishihara, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 15/026,322

(22) PCT Filed: Oct. 20, 2014

(86) PCT No.: PCT/JP2014/077834
§ 371 (c)(1),
(2) Date: Mar. 31, 2016

(87) PCT Pub. No.: WO2015/060248
PCT Pub. Date: Apr. 30, 2015

(65) Prior Publication Data
US 2016/0236968 A1    Aug. 18, 2016

(30) Foreign Application Priority Data
Oct. 21, 2013  (JP) ................. 2013-218021

(51) Int. Cl.
| | |
|---|---|
| *C03C 3/14* | (2006.01) |
| *C03C 8/24* | (2006.01) |
| *C03C 3/145* | (2006.01) |
| *C03C 8/04* | (2006.01) |
| *H01L 51/44* | (2006.01) |
| *H01L 51/52* | (2006.01) |
| *B23K 26/18* | (2006.01) |
| *B23K 26/20* | (2014.01) |
| *B23K 26/211* | (2014.01) |
| *H01L 31/0203* | (2014.01) |

(52) U.S. Cl.
CPC ................ *C03C 8/24* (2013.01); *B23K 26/18* (2013.01); *B23K 26/206* (2013.01);
(Continued)

(58) Field of Classification Search
CPC ....................................................... C03C 8/24
See application file for complete search history.

(56) References Cited

U.S. PATENT DOCUMENTS 6,416,375 B1    7/2002  Cho et al.
9,469,562 B2 *  10/2016  Masuda .................... C03C 3/14
(Continued)

FOREIGN PATENT DOCUMENTS

JP  2006-315902  11/2006
JP  2009-234816  10/2009
(Continued)

OTHER PUBLICATIONS

International Preliminary Report on Patentability issued Apr. 26, 2016 in International Application No. PCT/JP2014/077834.
(Continued)

*Primary Examiner* — Karl Group
(74) *Attorney, Agent, or Firm* — Wenderoth, Lind & Ponack, L.L.P.

(57) ABSTRACT

Provided is a sealing material that easily converts laser light to thermal energy, exhibits satisfactory fluidity, and is conducive to a reduction in its melting point. The sealing material includes 54.9 vol % to 99.9 vol % of glass powder, 0 vol % to 45 vol % of refractory filler powder, and 0.1 vol % to 10 vol % of a laser absorbing material, in which the glass powder includes as a glass composition, in terms of the following oxides in mass %, 70% to 90% of $Bi_2O_3$, 2% to 12% of $B_2O_3$, 1% to 15% of ZnO, 0.2% to 15% of $CuO+Fe_2O_3$, and 0.1% to 20% of $MgO+CaO+SrO+BaO$.

14 Claims, 1 Drawing Sheet

(52) U.S. Cl.
CPC .............. *B23K 26/211* (2015.10); *C03C 3/14* (2013.01); *C03C 3/145* (2013.01); *C03C 8/04* (2013.01); *H01L 31/0203* (2013.01); *H01L 51/448* (2013.01); *H01L 51/5246* (2013.01); *H01L 51/5253* (2013.01); *H01L 2251/303* (2013.01); *Y02E 10/549* (2013.01)

(56) References Cited

U.S. PATENT DOCUMENTS

| | | | | |
|---|---|---|---|---|
| 2011/0223371 | A1* | 9/2011 | Kawanami | ................ C03C 8/24 428/76 |
| 2012/0325311 | A1* | 12/2012 | Yamada | .................. C03C 3/066 136/256 |
| 2013/0174608 | A1* | 7/2013 | Takeuchi | .................. C03C 3/14 65/40 |
| 2014/0196502 | A1 | 7/2014 | Masuda et al. | |

FOREIGN PATENT DOCUMENTS

| | | | |
|---|---|---|---|
| JP | 2013-47170 | | 3/2013 |
| JP | 2013-49615 | | 3/2013 |
| WO | 2011158805 | * | 12/2011 |
| WO | 2013015414 | * | 1/2013 |

OTHER PUBLICATIONS

International Search Report issued Jan. 20, 2015 in International Application No. PCT/JP2014/077834.

\* cited by examiner

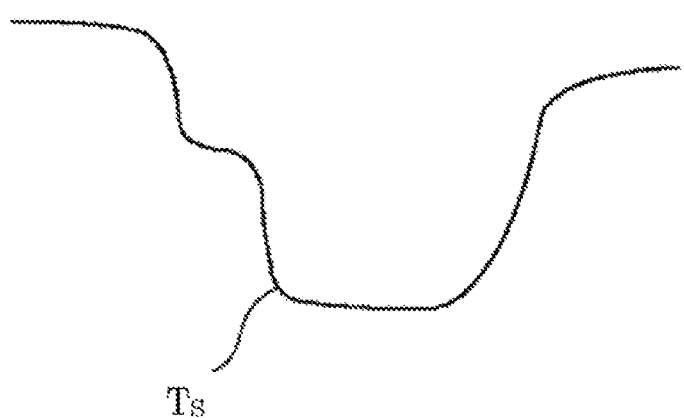

SEALING MATERIAL

TECHNICAL FIELD

The present invention relates to a sealing material, and more particularly, to a sealing material suitable for sealing treatment with laser light (hereinafter referred to as laser sealing).

BACKGROUND ART

In recent years, an OLED display has been attracting attention as a flat display panel. The OLED display can be driven by a DC voltage, and hence its drive circuit can be simplified. In addition, the OLED display has advantages such as having no viewing angle dependence unlike a liquid crystal display, being bright due to its self-luminescence, and having a rapid response speed. At present, the OLED display is mainly used in a small portable appliance, such as a mobile phone, and is expected to be applied to an ultra thin screen television in future. It should be noted that the OLED display mainly uses a system in which an active element, such as a thin-film transistor (TFT), is arranged at each pixel for driving as is the case with the liquid crystal display.

The OLED display comprises, for example, two glass substrates, a negative electrode made of a metal or the like, an organic light-emitting layer, a positive electrode made of ITO or the like, and a bonding material. Hitherto, an organic resin-based bonding material, such as an epoxy resin having a low-temperature curing property or a UV curable resin, has been used as the bonding material. However, the organic resin-based bonding material cannot block penetration of gas completely. Thus, when the organic resin-based bonding material is used, air tightness inside the OLED display cannot be maintained. Owing to this, the organic light-emitting layer, which has low water resistance, is liable to degrade, resulting in such a failure that a display characteristic of the OLED display degrades time-dependently. In addition, the organic resin-based bonding material has an advantage of being able to bond glass substrates to each other at low temperature, but has low water resistance. Therefore, when the OLED display is used over a long period, reliability of the display is liable to deteriorate.

Meanwhile, a sealing material containing glass powder has excellent water resistance and is suitable for providing the air tightness inside the OLED display, as compared to the organic resin-based bonding material.

However, the glass powder generally has a softening temperature of 300° C. or more, and hence it has been difficult to apply the glass powder to the OLED display. Specifically, when the glass substrates are sealed with each other with the above-mentioned sealing material, it has been necessary to put the whole OLED display in an electric furnace and fire it at a temperature equal to or higher than the softening temperature of the glass powder, thereby softening and flowing the glass powder. However, the active element used in the OLED display only has heat resistance to a temperature of from about 120° C. to about 130° C., and hence, when the glass substrates are sealed with each other by this method, the active element is damaged by heat, resulting in degradation of a display characteristic of the OLED display. In addition, an organic light-emitting material is also poor in heat resistance, and hence, when the glass substrates are sealed with each other by this method, the organic light-emitting material is damaged by heat, resulting in degradation of a display characteristic of the OLED display.

In view of the circumstances mentioned above, laser sealing has been investigated in recent years as a method of sealing the OLED display. The laser sealing can locally heat only the sites that should be sealed, and hence the glass substrates can be sealed with each other while thermal degradation of the active element and the like is prevented.

As an example of the laser sealing, in Patent Literatures 1 and 2, there is a disclosure of laser sealing of glass substrates of a field emission display.

CITATION LIST

Patent Literature 1: U.S. Pat. No. 6,416,375 B1
Patent Literature 2: JP 2006-315902 A

SUMMARY OF INVENTION

Technical Problem

However, in Patent Literatures 1 and 2, there is no disclosure of any specific material formulation, and hence it is unclear what kind of material formulation is suitable for the laser sealing. Therefore, even when laser light is radiated to a sealing material, the sealing material cannot absorb the laser light appropriately, and it is difficult to efficiently convert the laser light to thermal energy in the sites that should be sealed. It should be noted that, when the power of the laser light is increased, the laser sealing can be performed without optimization of the material formulation, but in this case, the active element and the like are heated, possibly resulting in degradation of a display characteristic of the OLED display.

In addition, according to investigations made by the inventors of the present invention, the sealing material is required to have fluidity in the laser sealing. When the sealing material has high fluidity, sealing strength is increased, and an air tightness defect, such as a leak, is less liable to be caused by a mechanical shock or the like. It should be noted that a reduction in melting point of the sealing material is effective for improving the fluidity.

Thus, the present invention has been made in view of the above-mentioned circumstances, and a technical object of the present invention is to provide a sealing material that easily converts laser light to thermal energy, exhibits satisfactory fluidity, and is conducive to a reduction in its melting point, to thereby enhance the long-term reliability of an OLED device or the like.

Solution to Problem

The inventors of the present invention have found that the above-mentioned technical object can be achieved by introducing glass powder formed of bismuth-based glass and a laser absorbing material into a sealing material, and introducing a predetermined amount of CuO and/or $Fe_2O_3$ into the glass composition of the glass powder. Thus, the finding is proposed as the present invention. That is, a sealing material according to one embodiment of the present invention comprises 54.9 vol % to 99.9 vol % of glass powder, 0 vol % to 45 vol % of refractory filler powder, and 0.1 vol % to 25 vol % of a laser absorbing material, wherein the glass powder comprises as a glass composition, in terms of the following oxides in mass %, 70% to 90% of $Bi_2O_3$, 2% to 12% of $B_2O_3$, 1% to 15% of ZnO, 0.2% to 15% of $CuO+Fe_2O_3$, and 0.1% to 20% of $MgO+CaO+SrO+BaO$. Herein, the content of "$CuO+Fe_2O_3$" refers to the total content of CuO and $Fe_2O_3$. The content of "MgO+CaO+SrO+BaO" refers to the total content of MgO, CaO, SrO, and BaO.

The bismuth-based glass has a feature of being less liable to form bubbles during laser sealing as compared to other glass systems. Therefore, the use of the bismuth-based glass can prevent a situation in which mechanical strength lowers in sealed sites owing to bubbles. Further, the bismuth-based glass has a feature of having high thermal stability as compared to the other glass systems. Therefore, the use of the bismuth-based glass can prevent a situation in which sealing strength lowers at the time of the laser sealing owing to devitrification.

In addition, when the glass composition range of the bismuth-based glass is restricted as described above, a softening point can be reduced while the thermal stability is maintained. As a result, satisfactory fluidity can be ensured at low temperature (500° C. or less, preferably 480° C. or less, more preferably 450° C. or less).

Further, the sealing material according to the embodiment of the present invention comprises 0.1 vol % or more of the laser absorbing material, and the glass powder comprises 0.2 mass % or more (preferably 1 mass % or more, more preferably 2 mass % or more, still more preferably 3 mass % or more, particularly preferably 4 mass % or more, most preferably 5 mass % or more) of $CuO+Fe_2O_3$ in the glass composition. With this, laser light can be converted to thermal energy efficiently, and only the sites that should be sealed can be heated locally. As a result, glass substrates can be sealed with each other while the thermal degradation of an active element or an organic light-emitting layer is prevented. It should be noted that, in the case of the laser sealing, a site 1 mm apart from an irradiated site has a temperature of 100° C. or less, and hence the thermal degradation of the active element or the organic light-emitting layer can be prevented.

Secondly, in the sealing material according to the embodiment of the present invention, it is preferred that the glass powder comprise as the glass composition 4 mass % or more of $CuO+Fe_2O_3$.

Thirdly, in the sealing material according to the embodiment of the present invention, it is preferred that the glass powder have a molar ratio BaO/ZnO of from 0.01 to 2 in the glass composition.

Fourthly, in the sealing material according to the embodiment of the present invention, it is preferred that the glass powder have a molar ratio $Bi_2O_3/B_2O_3$ of 1.6 or more in the glass composition.

Fifthly, in the sealing material according to the embodiment of the present invention, it is preferred that the glass powder have a molar ratio $Bi_2O_3$/ZnO of 1.55 or more in the glass composition.

Sixthly, in the sealing material according to the embodiment of the present invention, it is preferred that the glass powder comprise as the glass composition 0.1 mass % or more of BaO. With this, the thermal stability and a sealing property at low temperature can be enhanced.

Seventhly, in the sealing material according to the embodiment of the present invention, it is preferred that the glass powder comprise as the glass composition 5 mass % or more of $CuO+Fe_2O_3$, and have a molar ratio $Bi_2O_3/B_2O_3$ of 1.5 or less and a molar ratio BaO/ZnO of 0.7 or more in the glass composition. With this, a low-melting point characteristic and the thermal stability can be balanced at high levels. Besides, when laser light is radiated onto glass, the laser light is converted to thermal energy with high efficiency, and hence the glass is sufficiently softened so as to flow. As a result, the sealing strength between the glass substrates can be increased.

Eighthly, in the sealing material according to the embodiment of the present invention, it is preferred that the refractory filler powder comprise one kind or two or more kinds selected from cordierite, willemite, alumina, zirconium phosphate, zircon, zirconia, and tin oxide. With this, the thermal expansion coefficient of the sealing material can be reduced so as to be matched to that of an object to be sealed.

Ninthly, in the sealing material according to the embodiment of the present invention, it is preferred that the laser absorbing material comprise one kind or two or more kinds selected from a Cu-based oxide, an Fe-based oxide, a Cr-based oxide, a Mn-based oxide, and composite oxides thereof. Herein, the "Cu-based oxide", "Fe-based oxide", "Cr-based oxide", and "Mn-based oxide" each refer to an oxide containing the explicit component as an essential component, that is, refer to oxides containing as their essential components Cu, Fe, Cr, and Mn, respectively. Thus, also in the following description, the term "-based oxide" refers to an oxide containing an explicit component as an essential component.

Tenthly, in the sealing material according to the embodiment of the present invention, it is preferred that the laser absorbing material have an average particle diameter $D_{50}$ of from 0.01 μm to 3 μm. Herein, the "average particle diameter $D_{50}$" refers to a value measured with a laser diffractometer, and represents, in a cumulative particle size distribution curve on a volume basis obtained through measurement by laser diffractometry, a particle diameter at which the integration amount of particles from a smaller particle side is 50% in a cumulative manner.

Eleventhly, in the sealing material according to the embodiment of the present invention, it is preferred that the sealing material be substantially free of PbO. Herein, the "substantially free of PbO" refers to the case where the content of PbO is less than 1,000 ppm (by mass) in the sealing material. With this, environmental requirements in recent years can be satisfied.

Twelfthly, in the sealing material according to the embodiment of the present invention, it is preferred that the sealing material have a softening point of 500° C. or less. When the softening point is too high, the glass does not soften and flow sufficiently even when irradiated with laser light, and hence it is necessary to increase the power of the laser light in order to increase the sealing strength between the glass substrates. In addition, when the power of the laser light is increased, a thermal shock is increased between a laser light irradiated site and a laser light non-irradiated site during laser sealing, and cracks and the like are liable to occur in the sealed sites. Herein, the "softening point" refers to a value measured with a macro-type differential thermal analysis (DTA) apparatus, and in the DTA, the measurement starts from room temperature and the temperature increase rate is set to 10° C./min. It should be noted that the softening point measured with the macro-type DTA apparatus refers to a temperature (Ts) at a fourth inflection point shown in the FIGURE. It should be noted that a lower limit of the softening point is not particularly limited, but is preferably 390° C. or more in consideration of the thermal stability of the bismuth-based glass.

Thirteenthly, in the sealing material according to the embodiment of the present invention, it is preferred that the sealing material be used for sealing treatment with laser light. With this, the sealing material can be locally heated, and the thermal degradation of the active element or the organic light-emitting layer can be prevented. The kind of a light source of the laser light is not particularly limited, but for example, a semiconductor laser, a YAG laser, a $CO_2$ laser, an excimer laser, an infrared laser, and the like are preferred because these lasers are easy to handle. In addition, the laser light has a center emission wavelength of preferably from 500 nm to 1,600 nm, particularly preferably from 750 nm to 1,300 nm so that the laser light is appropriately absorbed by the bismuth-based glass.

Fourteenthly, in the sealing material according to the embodiment of the present invention, it is preferred that the sealing material be used for sealing an OLED device or a solar cell.

BRIEF DESCRIPTION OF DRAWINGS

The FIGURE is a chart for showing a softening point measured with a macro-type DTA apparatus.

DESCRIPTION OF EMBODIMENTS

A sealing material of the present invention comprises 54.9 vol % to 99.9 vol % of glass powder, 0 vol % to 45 vol % of refractory filler powder, and 0.1 vol % to 25 vol % of a laser absorbing material. The glass powder is a material that acts as a melting accelerate component, and hermetically integrates objects to be sealed with each other by softening and flowing through irradiation with laser light. The refractory filler powder is a material that acts as aggregate, and increases the mechanical strength of a sealing layer while reducing the thermal expansion coefficient of the sealing material. The laser absorbing material is a material for efficiently converting laser light to thermal energy by absorbing the laser light.

In the sealing material of the present invention, the content of the glass powder is from 54.9 vol % to 99.9 vol %, preferably from 60 vol % to 90 vol %, particularly preferably from 65 vol % to 80 vol %. When the content of the glass powder is too small, it becomes difficult to ensure desired fluidity. On the other hand, when the content of the glass powder is too large, it becomes difficult to ensure desired light absorption characteristics, thermal expansion coefficient, and mechanical strength.

The glass powder has a maximum particle diameter $D_{max}$ of preferably 10 µm or less, particularly preferably 5 µm or less. When the maximum particle diameter $D_{max}$ of the glass powder is too large, it becomes difficult to narrow a gap between glass substrates. In this case, a time period required for laser sealing can be shortened, and cracks and the like are less liable to occur in the glass substrates and sealed sites even when the thermal expansion coefficients of each glass substrate and the sealing material are largely different from each other. Herein, the "maximum particle diameter $D_{max}$" refers to a value measured with a laser diffractometer, and represents, in a cumulative particle size distribution curve on a volume basis obtained through measurement by laser diffractometry, a particle diameter at which the integration amount of particles from a smaller particle side is 99% in a cumulative manner.

In the sealing material of the present invention, the glass powder comprises as a glass composition, in terms of the following oxides in mass %, 70% to 90% of $Bi_2O_3$, 2% to 12% of $B_2O_3$, 1% to 15% of ZnO, 0.2% to 15% of $CuO+Fe_2O_3$, and 0.1% to 20% of MgO+CaO+SrO+BaO. The reasons for limiting the glass composition range of the glass powder according to the present invention are described below. It should be noted that, in the following description, the expression "%" represents "mass %" unless otherwise stated.

$Bi_2O_3$ is a main component for lowering a softening point. The content of $Bi_2O_3$ is from 70% to 90%, preferably from 75% to 90%, more preferably from 80% to 90%, still more preferably from 82% to 88%. When the content of $Bi_2O_3$ is less than 70%, the softening point becomes too high, and hence the glass is difficult to soften even when irradiated with laser light. On the other hand, when the content of $Bi_2O_3$ is more than 90%, the glass becomes thermally unstable, and hence the glass is liable to devitrify at the time of melting or irradiation.

$B_2O_3$ is a component that forms a glass network of bismuth-based glass. The content of $B_2O_3$ is from 2% to 12%, preferably from 3% to 10%, more preferably from 3% to 8%. When the content of $B_2O_3$ is less than 2%, the glass becomes thermally unstable, and hence the glass is liable to devitrify at the time of melting or irradiation. On the other hand, when the content of $B_2O_3$ is more than 12%, the softening point becomes too high, and hence the glass is difficult to soften even when irradiated with laser light.

The molar ratio $Bi_2O_3/B_2O_3$ is preferably 1.6 or more, 1.65 or more, or 1.9 or more, particularly preferably 2.5 or more. When the molar ratio $Bi_2O_3/B_2O_3$ is too small, the softening point becomes too high, and hence the glass is difficult to soften even when irradiated with laser light. It should be noted that, in the case where the content of $CuO+Fe_2O_3$ is large, fox example, 5 mass % or more, when the molar ratio $Bi_2O_3/B_2O_3$ is too large, the glass becomes thermally unstable, and hence the glass is liable to devitrify at the time of melting or irradiation. Therefore, in such case, the molar ratio $Bi_2O_3/B_2O_3$ is preferably 2.3 or less, 2.0 or less, 1.8 or less, 1.7 or less, or 1.6 or less, particularly preferably 1.5 or less.

ZnO is a component that suppresses the devitrification at the time of melting or irradiation, and reduces the thermal expansion coefficient. The content of ZnO is from 1% to 15%, preferably from 1.5% to 10%. When the content of ZnO is less than 1%, an effect of suppressing the devitrification at the time of melting or irradiation becomes poor. On the other hand, when the content of ZnO is more than 15%, the glass composition loses its component balance, and the glass is liable to devitrify contrarily.

The molar ratio $Bi_2O_3/ZnO$ is preferably 1.55 or more, from 1.6 to 10, from 3 to 9.5, from 4 to 9, or from 5 to 8.5, particularly preferably from 5.5 to 8. With this, a low-melting point characteristic and thermal stability can be balanced at high levels.

MgO+CaO+SrO+BaO is a component that suppresses the devitrification at the time of melting or irradiation. The content of MgO+CaO+SrO+BaO is from 0.1% to 20%, preferably from 0.1% to 15%, more preferably from 0.1% to 10%. When the content of MgO+CaO+SrO+BaO is more than 20%, the softening point becomes too high, and hence the glass is difficult to soften even when irradiated with laser light.

The content of BaO is preferably from 0.1% to 15% or from 0.1% to 8%. When the content of BaO is more than 15%, the softening point becomes too high, and hence the glass is difficult to soften even when irradiated with laser light. The contents of MgO, CaO, and SrO are each preferably from 0% to 5%, particularly preferably from 0% to 2%. When each of the contends of MgO, CaO, and SrO is too large, the softening point becomes too high, and hence the glass is difficult to soften even when irradiated with laser light.

The molar ratio BaO/ZnO is preferably from 0.01 to 2, from 0.03 to 1.5, from 0.05 to 1.2, from 0.1 to 0.9, or from 0.4 to 0.9, particularly preferably from 0.7 to 0.9. With this, the low-melting point characteristic and the thermal stability can be balanced at high levels.

CuO and $Fe_2O_3$ are each a component that has light absorption characteristics, and are also each a component that absorbs light having a predetermined center emission wavelength when irradiated with the light, to thereby facilitate the softening of the glass. In addition, CuO and $Fe_2O_3$ are each a component that suppresses the devitrification at the time of melting or irradiation. The content of CuO+ $Fe_2O_3$ is from 0.2% to 15%, preferably from 1% to 10%, more preferably from 2% to 9%, still more preferably from 3% to 8%, particularly preferably from 4% to 8%, most preferably from 5% to 8%. When the content of CuO+$Fe_2O_3$ is less than 0.2%, the light absorption characteristics deteriorate and the glass is difficult to soften even when irradiated with laser light. On the other hand, when the content of CuO+$Fe_2O_3$ is more than 15%, the glass composition loses its component balance, and the glass is liable to devitrify and the fluidity is liable to lower contrarily.

CuO is a component that has light absorption characteristics. That is, CuO is a component that absorbs light having a predetermined center emission wavelength when irradiated with the light, to thereby facilitate the softening of the glass. Further, CuO is a component that suppresses the devitrification at the time of melting or irradiation. The content of CuO is preferably from 0% to 15%, from 0.2% to 10%, or from 1% to 9%, particularly preferably from 3% to 7%. When the content of CuO is more than 15%, the glass composition loses its component balance, and the glass is liable to devitrify and the fluidity is liable to lower contrarily. It should be noted that, when the content of CuO is too small, the light absorption characteristics deteriorate and the glass is difficult to soften even when irradiated with laser light.

$Fe_2O_3$ is a component that has light absorption characteristics. That is, $Fe_2O_3$ is a component that absorbs light having a predetermined center emission wavelength when irradiated with the light, to thereby facilitate the softening of the glass. Further, $Fe_2O_3$ is a component that suppresses the devitrification at the time of melting or irradiation. The content of $Fe_2O_3$ is preferably from 0% to 7%, from 0.05% to 7%, or from 0.1% to 4%, particularly preferably from 0.2% to 2%. When the content of $Fe_2O_3$ is more than 7%, the glass composition loses its component balance, and the glass is liable to devitrify and the fluidity is liable to lower contrarily. It should be noted that, when the content of $Fe_2O_3$ is too small, the light absorption characteristics deteriorate and the glass is difficult to soften even when irradiated with laser light.

It is assumed that Fe in the glass composition is present in the form of $Fe^{2+}$ or $Fe^{3+}$, but in the present invention, the form of Fe in the glass composition is not limited to one of $Fe^{2+}$ and $Fe^{3+}$, and may be both forms. Thus, in the present invention, Fe in the form of $Fe^{2+}$ is considered in terms of $Fe_2O_3$. In particular, in the case of using an infrared laser, it is preferred to increase the ratio of $Fe^{2+}$ because $Fe^{2+}$ has an absorption peak in an infrared region. It is preferred to restrict a ratio $Fe^{2+}/Fe^{3+}$ to 0.03 or more (desirably 0.08 or more).

For example, the following components may be added in addition to the above-mentioned components. It should be noted that the components are added so that the total content is preferably 20% or less or 10% or less, particularly preferably 5% or less.

$SiO_2$ is a component that enhances water resistance. The content of $SiO_2$ is preferably from 0% to 10%, particularly preferably from 0% to 3%. When the content of $SiO_2$ is more than 10%, the softening point becomes too high, and hence the glass is difficult to soften even when irradiated with laser light.

$Al_2O_3$ is a component that enhances the water resistance. The content of $Al_2O_3$ is preferably from 0% to 5%, particularly preferably from 0.1% to 2%. When the content of $Al_2O_3$ is more than 5%, the softening point becomes too high, and hence the glass is difficult to soften even when irradiated with laser light.

$CeO_2$ is a component that suppresses the devitrification at the time or melting or irradiation. The content of $CeO_2$ is preferably from 0% to 5%, from 0% to 2%, or from 0% to 1%, particularly preferably from 0% to less than 0.1%. When the content of $CeO_2$ is too large, the glass composition loses its component balance, and the glass is liable to devitrify contrarily.

$Sb_2O_3$ is a component that suppresses the devitrification. The content of $Sb_2O_3$ is preferably from 0% to 5% or from 0% to 2%, particularly preferably from 0% to 1%. $Sb_2O_3$ has an effect of stabilizing the network structure of the bismuth-based glass, and when $Sb_2O_3$ is appropriately added, the thermal stability is less liable to lower even when the content of $Bi_2O_3$ is large, for example, 76% or more. It should be noted that, when the content of $Sb_2O_3$ is too large, the glass composition loses its component balance, and the glass is liable to devitrify contrarily.

$Nd_2O_3$ is a component that suppresses the devitrification. The content of $Nd_2O_3$ is preferably from 0% to 5% or from 0% to 2%, particularly preferably from 0% to 1%. $Nd_2O_3$ has an effect of stabilizing the network structure of the bismuth-based glass, and when $Nd_2O_3$ is appropriately added, the thermal stability is less liable to lower even when the content of $Bi_2O_3$ is large, for example, 76% or more. It should be noted that, when the content of $Nd_2O_3$ is too large, the glass composition loses its component balance, and the glass is liable to devitrify contrarily.

$WO_3$ is a component that suppresses the devitrification. The content of $WO_3$ is preferably from 0% to 10%, particularly preferably from 0% to 2%. However, when the content of $WO_3$ is too large, the glass composition loses its component balance, and the glass is liable to devitrify contrarily.

$In_2O_3$ and $Ga_2O_3$ are each a component that suppresses the devitrification. The content of $In_2O_3$+$Ga_2O_3$ (total content of $In_2O_3$ and $Ga_2O_3$) is preferably from 0% to 5%, particularly preferably from 0% to 3%. However, when the content of $In_2O_3$+$Ga_2O_3$ is too large, the glass composition loses its component balance, and the glass is liable to devitrify contrarily. It should be noted that the content of $In_2O_3$ is preferably from 0% to 1%, and the content of $Ga_2O_3$ is preferably from 0% to 0.5%.

$Li_2O$, $Na_2O$, $K_2O$, and $Cs_2O$ are each a component that reduces the softening point, but each have an action of promoting the devitrification at the time of melting. Therefore, the total content of those components is preferably 2% or less, particularly preferably less than 1%.

$P_2O_5$ is a component that suppresses the devitrification at the time of melting. However, when the addition amount of $P_2O_5$ is more than 1%, the glass is liable to undergo phase separation at the time of melting.

$La_2O_3$, $Y_2O_3$, and $Gd_2O_3$ are each a component that suppresses the phase separation at the time of melting. However, when the content of each of the components is more than 3%, the softening point becomes too high, and hence the glass is difficult to soften even when irradiated with laser light.

NiO, $V_2O_5$, CoO, $MoO_3$, $TiO_2$, and $MnO_2$ are each a component that has light absorption characteristics. That is, NiO, $V_2O_5$, CoO, $MoO_3$, $TiO_2$, and $MnO_2$ are each a component that absorbs light having a predetermined center emission wavelength when irradiated with the light, to thereby facilitate the softening of the glass. The content of each of the components is preferably from 0% to 7%, particularly preferably from 0% to 3%. When the content of each of the components is too large, the fluidity is liable to lower through the devitrification.

The above-mentioned bismuth-based glass has satisfactory light absorption characteristics, high thermal stability, and satisfactory fluidity at low temperature. As a result, the air tightness of an OLED device or the like can be ensured for a long period of time.

In the sealing material of the present invention, the content of the refractory filler powder is from 0 vol % to 45 vol %, preferably from 10 vol % to 45 vol % or from 20 vol % to 40 vol %, particularly preferably from 25 vol % to 35 vol %. When the content of the refractory filler powder is too large, the content of the glass powder is relatively reduced, and it becomes difficult to ensure desired light absorption characteristics and thermal stability. It should be noted that, when the content of the refractory filler powder is too small, an effect exhibited by the addition of the refractory filler powder becomes poor.

The refractory filler powder has a maximum particle diameter $D_{max}$ of preferably 15 µm or less, less than 10 µm, or less than 5 µm, particularly preferably less than 3 µm. When the maximum particle diameter $D_{max}$ of the refractory filler powder is too large, it becomes difficult to uniformize the gap between the glass substrates, re-suiting in a difficulty in reducing the thickness of the OLED device. In addition, when the maximum particle diameter $D_{max}$ of the refractory filler powder is too large, the gap between the glass substrates becomes large. In this case, cracks and the like are less liable to occur in the glass substrates and the sealed sites even when the thermal expansion coefficients of each glass substrate and the sealing material are largely different from each other.

The refractory filler powder has a specific surface area of preferably from 5.5 $m^2/g$ to 12.2 $m^2/g$ or from 6.5 $m^2/g$ to 11 $m^2/g$, particularly preferably from 7.5 $m^2/g$ to 10 $m^2/g$. When the specific surface area of the refractory filler powder is too small, it becomes difficult to homogeneously disperse the refractory filler powder in the sealing material, and there is a risk in that cracks locally occur. On the other hand, when the specific surface area of the refractory filler powder is too large, the amount of the refractory filler powder melting into the glass at the time of irradiation with laser light excessively increases, and the thermal stability of the sealing material is liable to lower. It should be noted that the "specific surface area of the refractory filler powder" refers to a value measured by a BET fluid process, and may be measured with, for example, Macsorb HM model-1210 manufactured by Mountech Co., Ltd.

A value obtained by multiplying the specific surface area of the refractory filler powder by the specific gravity of the refractory filler powder is preferably from 6 $m^2/cm^3$ to 14 $m^2/cm^3$ or from 7 $m^2/cm^3$ to 12 $m^2/cm^3$, particularly preferably from 8 $m^2/cm^3$ to 10 $m^2/cm^3$. When the value obtained by multiplying the specific surface area of the refractory filler powder by the specific gravity of the refractory filler powder is too small, it becomes difficult to homogeneously disperse the refractory filler powder in the sealing material, and there is a risk in that cracks locally occur. On the other hand, when the value obtained by multiplying the specific surface area of the refractory filler powder by the specific gravity of the refractory filler powder is too large, the amount of the refractory filler powder melting into the glass at the time of irradiation with laser light excessively increases, and the thermal stability of the sealing material is liable to lower.

Various materials may be used as the refractory filler powder. Of those, cordierite, willemite, alumina, zirconium phosphate, zircon, zirconia, and tin oxide are preferred. Those refractory filler powders each have a low thermal expansion coefficient, high mechanical strength, and satisfactory compatibility with the bismuth-based glass powder. Further, refractory filler powder other than the above-mentioned refractory filler powders, such as quartz glass or β-eucryptite, may be added in order to adjust the thermal expansion coefficient and fluidity of the sealing material, and improve the mechanical strength of the sealing material.

In the sealing material of the present invention, the content of the laser absorbing material is from 0.1 vol % to 25 vol %, preferably from 1 vol % to 20 vol %, from 2 vol % to 15 vol %, or from 3 vol % to 12 vol %, particularly preferably from 4 vol % to 10 vol %. When the content of the laser absorbing material is too small, it becomes difficult to convert the light energy of laser light to thermal energy. In particular, when the content of the laser absorbing material in the sealing material is restricted to 3 vol % or more in the case where the content of $CuO+Fe_2O_3$ in the glass composition of the glass powder is 4 mass % or more, the efficiency of the laser sealing can be remarkably enhanced. It should be noted that, when the content of the laser absorbing material is too large, the amount of the laser absorbing material melting into the glass at the time of irradiation with laser light excessively increases, and the thermal stability of the sealing material is liable to lower.

A volume ratio of the laser absorbing material to the refractory filler powder in the sealing material, that is, a ratio of (the content of the laser absorbing material)/(the content of the refractory filler powder) is preferably from 0.05 to 0.8, from 0.1 to 0.7, from 0.15 to 0.6, or from 0.2 to 0.55, particularly preferably from 0.25 to 0.55. With this, the thermal expansion coefficient of the sealing material can be properly reduced while the thermal stability of the sealing material is maintained.

The laser absorbing material has an average particle diameter $D_{50}$ of preferably from 0.01 µm to 3 µm, from 0.1 µm to 2.5 µm, or from 0.3 µm to 2 µm, particularly preferably from 0.5 µm to 1.5 µm. The laser absorbing material has a maximum particle diameter $D_{max}$ preferably less than 20 µm, less than 10 µm, or 6 µm or less, particularly preferably 4 µm or less. When the particle size of the laser absorbing material is too small, the laser absorbing material is liable to melt into the glass at the time of irradiation with laser light, and the thermal stability of the sealing material is liable to be impaired. On the other hand, when the particle size of the laser absorbing material is too large, it becomes difficult to homogeneously disperse the laser absorbing material in the sealing material, and there is a risk in that a sealing defect locally occurs.

Various materials may be used as the laser absorbing material. Among the various materials, a Cu-based oxide, an Fe-based oxide, a Cr-based oxide, a Mn-based oxide, and composite oxides thereof are preferred from the viewpoint of the compatibility with the bismuth-based glass. Of those, a Cu-based oxide and composite oxides thereof are particularly preferred from the viewpoint of the light absorption characteristics, and a Mn-based oxide and composite oxides thereof are particularly preferred from the viewpoint of the compatibility with the bismuth-based glass.

Further, the laser absorbing material is preferably colored in black. When a black laser absorbing material is used, the light energy of laser light is easily converted to thermal energy, and a situation in which an appearance defect occurs in the sealed sites can be prevented even when foreign matter is mixed in the sealing material. As the black laser absorbing material, an Al—Cu—Fe—Mn-based composite oxide, an Al—Fe—Mn-based composite oxide, a Co—Cr—Fe-based composite oxide, a Co—Cr—Fe—Mn-based composite oxide, a Co—Cr—Fe—Ni-based composite oxide, a Co—Cr—Fe—Mn-based composite oxide, a Co—Cr—Fe—Ni—Zn-based composite oxide, a Co—Fe—Mn—Ni-based composite oxide, a Cr—Cu-based composite oxide, a Cr—Cu—Mn-based composite oxide, a Cr—Fe—Mn-based composite oxide, an Fe—Mn-based composite oxide, and $Cr_2O_3$ are preferred, and an Al—Fe—Mn-based composite oxide is particularly preferred from the viewpoint of compatibility with the bismuth-based glass.

In general, an alkali-free glass substrate (for example, OA-10G manufactured by Nippon Electric Glass Co., Ltd.) is used as glass substrates for the OLED device. The alkali-free glass substrate generally has a thermal expansion coefficient of $40 \times 10^{-7}/°$ C. or less. In the case of sealing such alkali-free glass substrates with each other, it is necessary to match the thermal expansion coefficient of the sealing material to those of the alkali-free, glass substrates. Therefore, it is important to reduce the thermal expansion coefficient of the sealing material, and the thermal expansion coefficient of the sealing material is preferably $85 \times 10^{-7}/°$ C. or less, $80 \times 10^{-7}/°$ C. or less, or $75 \times 10^{-7}/°$ C. or less, particularly preferably $70 \times 10^{-7}/°$ C. or less. With this, a stress applied to the sealed sites becomes small, and hence stress fracture is easily prevented in the sealed sites. However, when the thermal expansion coefficient of the sealing material is reduced to the extent possible, the content of the refractory filler powder becomes excessive, and hence the content of the glass powder is inevitably relatively reduced. As a result, it becomes difficult to ensure desired light absorption characteristics and thermal stability. In consideration of such circumstances, for example, in the case of using the alkali-free glass substrate, a difference in thermal expansion coefficient between the alkali-free glass substrate and the sealing material is preferably from $15 \times 10^{-7}/°$ C. to $60 \times 10^{-7}/°$ C., from $20 \times 10^{-7}/°$ C. to $60 \times 10^{-7}/°$ C., or from $30 \times 10^{-7}/°$ C. to $50 \times 10^{-7}/°$ C. Herein, the "thermal expansion coefficient" refers to a value measured with a push-rod-type thermal expansion coefficient measurement (TMA) apparatus, and a measurement temperature range is set to from 30° C. to 300° C.

In the sealing material of the present invention, the softening point is preferably 500° C. or less, 480° C. or less, or 450° C. or less, particularly preferably 430° C. or less. When the softening point is too high, there is a tendency that the glass is difficult to soften even when irradiated with laser light. It is necessary to increase the power of the laser light in order to increase the sealing strength between the glass substrates.

The sealing material of the present invention may be used in the form of powder, but is easy to handle when homogeneously raised and kneaded with a vehicle and processed into a paste. The vehicle is formed mainly of a solvent and a resin. The resin is added for the purpose of adjusting the viscosity of the paste. In addition, a surfactant, a thickener, or the like may be added as required. A paste produced is applied onto the glass substrate with an applicator, such as a dispenser or a screen printing machine, and subjected to a binder removal step.

For example, an acrylic acid ester (acrylic resin), ethylcellulose, a polyethylene glycol derivative, nitrocellulose, polymethylstyrene, polyethylene carbonate, or a methacrylic acid ester may be used as the resin. In particular, an acrylic acid ester or nitrocellulose is preferred from the viewpoint of its good pyrolytic characteristic.

For example, the following solvents may be used as the solvent: N,N'-dimethylformamide (DMF), α-terpineol, a higher alcohol, γ-butyrolactone (γ-BL), tetralin, butylcarbitol acetate, ethyl acetate, isoamyl acetate, diethylene glycol monoethyl ether, diethylene glycol monoethyl ether acetate, benzyl alcohol, toluene, 3-methoxy-3-methylbutanol, triethylene glycol monomethyl ether, triethylene glycol dimethyl ether, dipropylene glycol monomethyl ether, dipropylene glycol monobutyl ether, tripropylene glycol monomethyl ether, tripropylene glycol monobutyl ether, propylene carbonate, dimethyl sulfoxide (DMSO), and N-methyl-2-pyrrolidone. Of those, α-terpineol is particularly preferred because α-terpineol has a high viscosity and the resin or the like has satisfactory solubility in α-terpineol.

Example 1

The present invention is described in detail by way of Examples. Examples (Sample Nos. 1 to 8) and Comparative Examples (Sample Nos. 9 and 10) of the present invention are shown in Tables 1 and 2. It should be noted that the following Examples are merely illustrative. The present invention is by no means limited to the following Examples.

TABLE 1

| | | Example | | | |
|---|---|---|---|---|---|
| | | No. 1 | No. 2 | No. 3 | No. 4 |
| Glass composition (mass %) | $Bi_2O_3$ | 85.8 | 83.1 | 86.1 | 78.0 |
| | $B_2O_3$ | 5.7 | 5.9 | 5.7 | 7.0 |
| | ZnO | 2.1 | 2.1 | 2.6 | 8.5 |
| | CuO | 4.3 | 4.5 | 4.3 | 5.0 |
| | $Fe_2O_3$ | 0.4 | 0.4 | 0.4 | 0.5 |
| | SrO | — | — | — | — |
| | BaO | 1.7 | 4.0 | 0.9 | 1.0 |
| | $Al_2O_3$ | — | — | — | — |
| (Molar ratio) | BaO/ZnO | 0.43 | 1.00 | 0.18 | 0.06 |
| | $Bi_2O_3/B_2O_3$ | 2.25 | 2.10 | 2.26 | 1.66 |
| | $Bi_2O_3$/ZnO | 7.13 | 6.91 | 5.78 | 1.60 |

TABLE 1-continued

|  | | | | |
|---|---|---|---|---|
| Refractory filler powder | Cordierite | Cordierite | Cordierite | Cordierite |
| Laser absorbing material | Mn—Fe—Al-based | Mn—Fe—Al-based | Mn—Fe—Al-based | Mn—Fe—Al-based |
| Mixed ratio (vol %) Glass powder/filler powder/absorbing material | 68/30/2 | 69/30/1 | 67/28/5 | 71/23/6 |
| Thermal expansion coefficient (×$10^{-7}$/° C.) | 85 | 86 | 85 | 79 |
| Glass transition point (° C.) | 355 | 352 | 360 | 394 |
| Softening point (° C.) | 410 | 416 | 415 | 441 |
| Fluidity | ○ | ○ | ○ | ○ |
| Laser sealing strength | ○ | ○ | ○ | ○ |
| Air tightness after laser sealing | ○ | ○ | ○ | ○ |

| | | Example | | | |
|---|---|---|---|---|---|
| | | No. 5 | No. 6 | No. 7 | No. 8 |
| Glass composition (mass %) | $Bi_2O_3$ | 87.0 | 76.6 | 77.3 | 77.8 |
| | $B_2O_3$ | 6.2 | 8.1 | 8.2 | 8.3 |
| | ZnO | 3.5 | 3.3 | 2.5 | 1.8 |
| | CuO | 1.5 | 5.5 | 7.1 | 8.5 |
| | $Fe_2O_3$ | 0.4 | 0.5 | 0.5 | 0.5 |
| | SrO | 0.3 | — | — | — |
| | BaO | 1.1 | 6.0 | 4.0 | 2.7 |
| | $Al_2O_3$ | — | — | 0.5 | 0.5 |
| (Molar ratio) | BaO/ZnO | 0.17 | 0.96 | 0.86 | 0.80 |
| | $Bi_2O_3/B_2O_3$ | 2.10 | 1.41 | 1.41 | 1.41 |
| | $Bi_2O_3/ZnO$ | 4.34 | 4.05 | 5.43 | 7.60 |
| Refractory filler powder | | Cordierite | Cordierite | Cordierite | Cordierite |
| Laser absorbing material | | Mn—Fe—Al-based | Mn—Fe—Al-based | Mn—Fe—Al-based | Mn—Fe—Al-based |
| Mixed ratio (vol %) Glass powder/filler powder/absorbing material | | 55/35/10 | 71.5/28/0.5 | 67/21/12 | 72/25/3 |
| Thermal expansion coefficient (×$10^{-7}$/° C.) | | 69 | 78 | 86 | 82 |
| Glass transition point (° C.) | | 367 | 400 | 399 | 403 |
| Softening point (° C.) | | 453 | 443 | 454 | 449 |
| Fluidity | | ○ | ○ | ○ | ○ |
| Laser sealing strength | | ○ | ○ | ○ | ○ |
| Air tightness after laser sealing | | ○ | ○ | ○ | ○ |

TABLE 2

| | | Comparative Example | |
|---|---|---|---|
| | | No. 9 | No. 10 |
| Glass composition (mass %) | $Bi_2O_3$ | 84.0 | 80.0 |
| | $B_2O_3$ | 6.2 | 7.2 |
| | ZnO | 9.8 | 8.1 |
| | CuO | — | 0.1 |
| | $Fe_2O_3$ | — | — |
| | SrO | — | — |
| | BaO | — | 4.6 |
| (Molar ratio) | BaO/ZnO | 0 | 0.30 |
| | $Bi_2O_3/B_2O_3$ | 2.02 | 1.66 |
| | $Bi_2O_3/ZnO$ | 1.50 | 1.70 |
| Refractory filler powder | | Cordierite | Cordierite |
| Laser absorbing material | | — | — |
| Mixed ratio (vol %) Glass powder/filler powder/absorbing material | | 60/40/0 | 72/28/0 |
| Thermal expansion coefficient (×$10^{-7}$/° C.) | | 83 | 75 |
| Glass transition point (° C.) | | 350 | 355 |
| Softening point (° C.) | | 435 | 440 |
| Fluidity | | x | ○ |
| Laser sealing strength | | x | x |
| Air tightness after laser sealing | | x | x |

The samples shown in the tables were each prepared as described below. First, a glass batch was prepared by blending raw materials, such as various oxides and carbonates, so as to achieve a glass composition shown in the tables, and the glass batch was loaded into a platinum crucible and melted at from 1,000° C. to 1,100° C. for 1 hour. Next, the resultant molten glass was formed into a thin sheet shape with a water-cooled roller. Finally, the glass in a thin sheet shape was pulverized with a ball mill, followed by air classification. Thus, glass powders each having an average particle diameter $D_{50}$ of 2.5 µm and a maximum particle diameter $D_{max}$ of 10 µm were obtained.

Cordierite was used as refractory filler powder. Cordierite powder is adjusted to have an average particle diameter $D_{50}$ of 2.5 µm and a maximum particle diameter $D_{max}$ of 10 µm through air classification. It should be noted that, as described above, the refractory filler powder has a maximum particle diameter $D_{max}$ of preferably less than 10 µm or less than 5 µm, particularly preferably less than 3 µm. In addition, the refractory filler powder has a specific surface area of preferably from 5.5 m$^2$/g to 12.2 m$^2$/g or from 6.5 m$^2$/g to 11 m$^2$/g, particularly preferably from 7.5 m$^2$/g to 10 m$^2$/g. Further, the value obtained by multiplying the specific surface area of the refractory filler powder by the specific gravity of the refractory filler powder is preferably from 6 m$^2$/cm$^3$ to 14 m$^2$/cm$^3$ or from 7 m$^2$/cm$^3$ to 12 m$^2$/cm$^3$, particularly preferably from 8 m$^2$/cm$^3$ to 10 m$^2$/cm$^3$. For example, it is preferred that the cordierite powder be adjusted to have an average particle diameter $D_{50}$ so of 1.5 µm, a maximum particle diameter $D_{max}$ of 3 µm, a specific surface area of 9.0 m$^2$/g, and a value obtained by multiplying its specific surface area by its specific gravity of 24.0 m$^2$/cm$^3$.

An Al—Fe—Mn-based composite oxide (42-343B manufactured by Tokan Material Technology Co., Ltd.) was used as a laser absorbing material. The Al—Fe—Mn-based composite oxide has an average particle diameter $D_{50}$ of 1.0 µm and a maximum particle diameter $D_{max}$ of 2.5 µm.

The bismuth-based glass powder, the refractory filler powder, and the laser absorbing material were mixed as shown in the tables, to produce Sample Nos. 1 to 10. Sample Nos. 1 to 10 were each evaluated for a thermal expansion coefficient, a glass transition point, a softening point, laser sealing strength, fluidity, and air tightness after laser sealing.

The thermal expansion coefficient and the glass transition point were measured with a TMA apparatus. The thermal expansion coefficient was measured in a temperature range of from 30° C. to 300° C. It should be noted that each sample was used as a measurement sample after densely sintered and then processed into a predetermined shape.

The softening point was determined with a DTA apparatus. The measurement was performed in air, and a temperature increase rate was set to 10° C./min.

The fluidity was evaluated as described below. The powders having masses corresponding to a combination density of each sample were dry-pressed into a button shape having an outer diameter of 20 mm in a mold, and the resultant was placed on a high-strain-point glass substrate measuring 40 mm×40 mm×2.8 mm in thickness. In air, the temperature was increased at a rate of 10° C./min, and then retained at a temperature of the softening point of each sample +30° C. for 10 minutes, and reduced to room temperature at a rate of 10° C./min. Then, the diameter of the resultant button was measured. Specifically, the case where a fluid diameter was 20 mm or more was evaluated as "o", and the case where the fluid diameter was less than 20 mm was evaluated as "x". It should be noted that the "combination density" refers to a theoretical density calculated by combining the density of the glass powder and the density of the refractory filler powder at a predetermined volume ratio of these powders.

The laser sealing strength was evaluated as described below. First, each sample was homogeneously mixed and kneaded with a vehicle (α-terpineol containing an ethylcellulose resin) in a three-roll mill, to be formed into a paste. Then, the paste was applied in a frame shape (30 µm in thickness and 0.6 mm in width) onto an alkali-free glass substrate (OA-10 manufactured by Nippon Electric Glass Co., Ltd., 40 mm square×0.5 mm in thickness) so as to follow the end edge of the alkali-free glass substrate, and dried at 125° C. for 10 minutes in a dry oven. Next, the temperature was increased at a rate of 10° C./min from room temperature, and retained at a temperature of the softening point of each sample +30° C. for 10 minutes to fire the sample, and then reduced at a rate of 10° C./min to room temperature. Thus, a resin component in the paste was burned up (subjected to binder removal treatment), and a sealing material was fixed. Next, another alkali-free glass substrate (40 mm square×0.5 mm in thickness) was precisely laminated on the alkali-free glass substrate having fixed thereonto the sealing material. Then, laser light having a wavelength of 808 nm was radiated along the sealing material from the side of the alkali-free glass substrate having fixed thereonto the sealing material, to allow the sealing material to soften and flow, to thereby hermetically seal the alkali-free glass substrates with each other. It should be noted that the irradiation conditions of the laser light (power and irradiation rate) were adjusted depending on the average film thickness of the sealing material. Finally, the glass substrates after the laser sealing were dropped on concrete from 1 m above the concrete, and the case where no detachment occurred in the laser sealed sites was evaluated as "o", and the case where detachment occurred in the laser sealed sites was evaluated as "x".

The air tightness after laser sealing was evaluated as described below. The sealing material was applied and fixed onto an alkali-free glass substrate (40 mm square×0.5 mm in thickness) in the same manner as in the case of the evaluation of the laser sealing strength. Subsequently, a metal Ca film (20 mm square×300 nm in thickness) was formed on another alkali-free glass substrate (40 mm square×0.5 mm in thickness) through vacuum vapor deposition. In a grove box in which humidity and an oxygen concentration were controlled, the alkali-free glass substrate having formed thereon the metal Ca film was precisely laminated on the alkali-free glass substrate having fixed thereonto the sealing material, and then laser light having a wavelength of 808 nm was radiated along the sealing material from the side of the alkali-free glass substrate having fixed thereonto the sealing material, to allow the sealing material to soften and flow, to thereby hermetically seal the alkali-free glass substrates with each other so that the metal Ca film was sealed between the alkali-free glass substrates. It should be noted that the irradiation conditions of the laser light (power and irradiation rate) were adjusted depending on the average film thickness of the sealing material. The alkali-free glass substrates after the laser sealing were retained in a bath of constant temperature and constant humidity under the conditions of 40° C. and 90% RH for 1,500 hours. After that, the case where the metal Ca film retained its metallic luster was evaluated as "o", and the case the metal Ca film turned transparent was evaluated as "x". It should be noted that the metal Ca film is converted to transparent calcium hydroxide through a reaction with moisture.

As is apparent from Tables 1 and 2, Sample Nos. 1 to 8 had glass transition points of from 352° C. to 403° C., softening points of from 410° C. to 454° C., and thermal expansion coefficients α of from 69×10$^{-7}$/° C. to 86×10$^{-7}$/° C., and achieved satisfactory results in the evaluations of fluidity, laser sealing strength, and air tightness after laser sealing. On the other hand, the sealing materials of Sample Nos. 9 and 10 did not contain the laser absorbing material and had a small content of CuO+Fe$_2$O$_3$ in the glass powder, and hence the sealing materials did not sufficiently soften even when irradiated with laser light, and the laser sealing was not able to be performed properly.

INDUSTRIAL APPLICABILITY

The sealing material of the present invention is suitable not only for laser sealing of an OLED device, such as an OLED display or an OLED lighting apparatus, but also for laser sealing of a solar cell, such as a dye-sensitized solar cell or a CIGS-based thin-film compound solar cell, laser sealing of an MEMS package, or the like.

The invention claimed is:

1. A sealing material, comprising 54.9 vol % to 97 vol % of glass powder, 0 vol % to 45 vol % of refractory filler powder, and 3 vol % to 25 vol % of a laser absorbing material,
wherein the glass powder comprises as a glass composition, in terms of the following oxides in mass %, 70% to 90% of $Bi_2O_3$, 2% to 12% of $B_2O_3$, 1% to 15% of ZnO, 0.2% to 15% of $CuO+Fe_2O_3$, and 0.1% to 20% of $MgO+CaO+SrO+BaO$.

2. The sealing material according to claim 1, wherein the glass powder comprises as the glass composition 4 mass % or more of $CuO+Fe_2O_3$.

3. The sealing material according to claim 1, wherein the glass powder has a molar ratio BaO/ZnO of from 0.01 to 2 in the glass composition.

4. The sealing material according to claim 1, wherein the glass powder has a molar ratio $Bi_2O_3/B_2O_3$ of 1.6 or more in the glass composition.

5. The sealing material according to claim 1, wherein the glass powder has a molar ratio $Bi_2O_3/ZnO$ of 1.55 or more in the glass composition.

6. The sealing material according to claim 1, wherein the glass powder comprises as the glass composition 0.1 mass % or more of BaO.

7. The sealing material according to claim 1, wherein the glass powder comprises as the glass composition 5 mass % or more of $CuO+Fe_2O_3$, and has a molar ratio $Bi_2O_3/B_2O_3$ of 1.5 or less and a molar ratio BaO/ZnO of 0.7 or more in the glass composition.

8. The sealing material according to claim 1, wherein the refractory filler powder comprises one or more selected from the group consisting of cordierite, willemite, alumina, zirconium phosphate, zircon, zirconia, and tin oxide.

9. The sealing material according to claim 1, wherein the laser absorbing material comprises one or more selected from the group consisting of a Cu-based oxide, an Fe-based oxide, a Cr-based oxide, a Mn-based oxide, and composite oxides thereof.

10. The sealing material according to claim 1, wherein the laser absorbing material has an average particle diameter $D_{50}$ of from 0.01 µm to 3 µm.

11. The sealing material according to claim 1, wherein the sealing material is substantially free of PbO.

12. The sealing material according to claim 1, wherein the sealing material has a softening point of 500° C. or less.

13. The sealing material according to claim 1, wherein the sealing material is used for sealing treatment with laser light.

14. The sealing material according to claim 1, wherein the sealing material is used for sealing an OLED device or a solar cell.

* * * * *